United States Patent
Pal

(10) Patent No.: US 9,823,289 B2
(45) Date of Patent: Nov. 21, 2017

(54) AUTOMATED DIGITAL EARTH FAULT SYSTEM

(71) Applicant: Biplab Pal, Ellicott City, MD (US)

(72) Inventor: Biplab Pal, Ellicott City, MD (US)

(73) Assignee: Prophecy Sensorlytics LLC, Baltimore, MD (US)

( * ) Notice: Subject to any disclaimer, the term of this patent is extended or adjusted under 35 U.S.C. 154(b) by 99 days.

(21) Appl. No.: 14/726,696

(22) Filed: Jun. 1, 2015

(65) Prior Publication Data
US 2016/0349305 A1     Dec. 1, 2016

(51) Int. Cl.
*G01R 31/14*     (2006.01)
*G01R 31/02*     (2006.01)
(Continued)

(52) U.S. Cl.
CPC .......... *G01R 31/025* (2013.01); *G01R 31/08* (2013.01); *G01R 31/28* (2013.01); *G01R 27/18* (2013.01); *H04L 41/0677* (2013.01)

(58) Field of Classification Search
CPC .... G01R 27/18; G01R 31/024; G01R 31/025; G01R 31/021; G01R 31/08; G01R 31/28; G01R 31/10; H04B 3/46; H04L 41/0677
USPC ....... 324/500, 508, 509, 541, 544, 551, 512, 324/527, 528, 531, 537, 555, 750.01, 324/750.02, 601, 202, 76.11, 130; 361/42, 63, 65, 88, 93.1; 702/85
See application file for complete search history.

(56) References Cited

U.S. PATENT DOCUMENTS

| | | |
|---|---|---|
| 5,150,289 A | 9/1992 | Badavas |
| 5,487,225 A | 1/1996 | Downie |

(Continued)

FOREIGN PATENT DOCUMENTS

| | | |
|---|---|---|
| CN | 201672991 | 12/2010 |
| CN | 102539911 A | 7/2012 |

(Continued)

OTHER PUBLICATIONS

International Search Report and Written Opinion for PCT Application No. PCT/US16/18820; dated Aug. 4, 2016.
(Continued)

*Primary Examiner* — Giovanni Astacio-Oquendo
*Assistant Examiner* — Raul Rios Russo
(74) *Attorney, Agent, or Firm* — Fox Rothschild LLP

(57) ABSTRACT

An automated earth fault testing system and early warning system designed to be used with mobile towers for real-time monitoring of the earthing values. The automated earth fault testing system comprises an earth fault testing device powered by a low voltage direct current battery, a plurality of terminals, at least one calibration switch including a calibration pad for calibrating the earth fault testing device, a plurality of visual indication means for providing indication of a variety of conditions including high and/or normal value of the earth resistance value and for indicating a charge level of the earth fault testing device and a liquid crystal display for displaying the earthing values. The earth fault testing device is connected to an alarm system of a base transceiver station utilizing a relay for informing the mobile signal station and operator with information regarding a status of the earth fault testing device.

12 Claims, 4 Drawing Sheets

(51) Int. Cl.
*G01R 31/28* (2006.01)
*G01R 31/08* (2006.01)
*H04L 12/24* (2006.01)
*G01R 27/18* (2006.01)

(56) References Cited

U.S. PATENT DOCUMENTS

| | | | |
|---|---|---|---|
| 5,610,339 | A | 3/1997 | Haseley et al. |
| 5,825,338 | A | 10/1998 | Salmon et al. |
| 5,995,561 | A | 11/1999 | Yamasaki et al. |
| 6,289,606 | B2 | 9/2001 | Gillette et al. |
| 6,405,108 | B1 | 6/2002 | Patel et al. |
| 7,406,399 | B2 | 7/2008 | Furem et al. |
| 7,882,394 | B2 | 2/2011 | Hosek et al. |
| 7,938,935 | B2 | 5/2011 | MacHattie et al. |
| 8,021,462 | B2 | 9/2011 | Moretto |
| 8,112,381 | B2 | 2/2012 | Yuan et al. |
| 8,126,574 | B2 | 2/2012 | Discenzo et al. |
| 8,150,340 | B2 | 4/2012 | Albsmeier et al. |
| 8,390,299 | B2 | 3/2013 | Laepple et al. |
| 8,405,940 | B2 | 3/2013 | Schweitzer, III et al. |
| 8,433,443 | B2 | 4/2013 | Hagerty et al. |
| 8,560,368 | B1 | 10/2013 | Maity et al. |
| 8,571,904 | B2 | 10/2013 | Guru et al. |
| 8,726,535 | B2 | 5/2014 | Garrido et al. |
| 8,868,242 | B2 | 10/2014 | Loutfi |
| 8,920,078 | B2 | 12/2014 | Woolever |
| 9,052,216 | B2 | 6/2015 | Kamel et al. |
| 9,062,536 | B2 | 6/2015 | Fischer |
| 2002/0143421 | A1 | 10/2002 | Wetzer |
| 2004/0199573 | A1 | 10/2004 | Schwartz et al. |
| 2006/0168195 | A1 | 7/2006 | Maturana et al. |
| 2006/0208169 | A1 | 9/2006 | Breed et al. |
| 2006/0276949 | A1 | 12/2006 | Beck et al. |
| 2007/0100518 | A1 | 5/2007 | Cooper |
| 2007/0193056 | A1 | 8/2007 | Switalski |
| 2008/0109185 | A1 | 5/2008 | Cheung et al. |
| 2008/0289045 | A1 | 11/2008 | Fryer |
| 2009/0024359 | A1 | 1/2009 | Bibelhausen et al. |
| 2009/0043518 | A1 | 2/2009 | Roh et al. |
| 2009/0119243 | A1 | 5/2009 | Yuan et al. |
| 2010/0169030 | A1 | 7/2010 | Parlos |
| 2010/0199352 | A1 | 8/2010 | Hill et al. |
| 2010/0295692 | A1* | 11/2010 | Bjorn ............... G01R 15/246 340/650 |
| 2011/0016199 | A1 | 1/2011 | De Carlo et al. |
| 2011/0131398 | A1 | 6/2011 | Chaturvedi et al. |
| 2011/0137697 | A1 | 6/2011 | Yedatore et al. |
| 2011/0216805 | A1 | 9/2011 | Fernando et al. |
| 2012/0045068 | A1 | 2/2012 | Kim et al. |
| 2012/0209569 | A1 | 8/2012 | Becourt et al. |
| 2012/0213098 | A1 | 8/2012 | Sun |
| 2012/0271576 | A1 | 10/2012 | Kamel |
| 2012/0290104 | A1 | 11/2012 | Holt et al. |
| 2012/0330499 | A1 | 12/2012 | Scheid et al. |
| 2012/0330614 | A1 | 12/2012 | Kar |
| 2013/0102284 | A1 | 4/2013 | Storozuk |
| 2013/0170417 | A1 | 7/2013 | Thomas et al. |
| 2013/0173178 | A1 | 7/2013 | Poczka et al. |
| 2013/0201316 | A1 | 8/2013 | Binder et al. |
| 2013/0268469 | A1 | 10/2013 | Sharma et al. |
| 2013/0287060 | A1 | 10/2013 | Langdoc et al. |
| 2013/0304677 | A1 | 11/2013 | Gupta et al. |
| 2013/0318022 | A1 | 11/2013 | Yadav et al. |
| 2014/0129164 | A1 | 5/2014 | Gorbold |
| 2014/0163416 | A1 | 6/2014 | Shuck |
| 2014/0207394 | A1 | 7/2014 | Madden |
| 2014/0223767 | A1 | 8/2014 | Arno |
| 2014/0244836 | A1 | 8/2014 | Goel et al. |
| 2014/0262130 | A1 | 9/2014 | Yenni |
| 2014/0309805 | A1 | 10/2014 | Ricci |
| 2014/0314284 | A1 | 10/2014 | Movellan et al. |
| 2014/0335480 | A1 | 11/2014 | Asenjo et al. |
| 2014/0336791 | A1 | 11/2014 | Asenjo et al. |
| 2014/0337429 | A1 | 11/2014 | Asenjo et al. |
| 2015/0026044 | A1 | 1/2015 | Refaeli |
| 2015/0039250 | A1 | 2/2015 | Rank |
| 2015/0094914 | A1 | 4/2015 | Abreu |
| 2015/0139817 | A1 | 5/2015 | Kowalski |
| 2015/0141064 | A1* | 5/2015 | Bjorn ............... G01R 15/246 455/466 |
| 2015/0181313 | A1 | 6/2015 | Murphy |
| 2015/0185251 | A1* | 7/2015 | Heydron ............... G01R 15/00 324/754.02 |
| 2016/0086285 | A1 | 3/2016 | Jordan Peters et al. |
| 2016/0134101 | A1* | 5/2016 | Kalina ............... H02H 7/222 361/47 |
| 2016/0189440 | A1 | 6/2016 | Cattone |
| 2016/0209831 | A1 | 7/2016 | Pal |
| 2016/0245279 | A1 | 8/2016 | Pal et al. |
| 2016/0245686 | A1 | 8/2016 | Pal et al. |
| 2016/0245765 | A1 | 8/2016 | Pal |
| 2016/0291552 | A1 | 10/2016 | Pal et al. |
| 2016/0299183 | A1* | 10/2016 | Lee ............... G01R 31/02 |
| 2016/0313216 | A1 | 10/2016 | Pal et al. |
| 2017/0061608 | A1 | 3/2017 | Kim et al. |

FOREIGN PATENT DOCUMENTS

| | | |
|---|---|---|
| CN | 103399486 A | 11/2013 |
| CN | 203362223 U | 12/2013 |
| CN | 203588054 U | 5/2014 |
| CN | 104036614 A | 9/2014 |
| EP | 1836576 B1 | 2/2012 |
| EP | 2186613 B1 | 5/2013 |
| EP | 2648393 A1 | 10/2013 |
| WO | WO 2005/086760 A2 | 9/2005 |
| WO | WO 2010/104735 A1 | 9/2010 |
| WO | WO 2013/040855 A1 | 3/2013 |
| WO | WO 2013/093942 A2 | 6/2013 |
| WO | WO 2014/044906 A1 | 3/2014 |
| WO | WO 2014/085648 A1 | 6/2014 |
| WO | WO 2014/089567 A2 | 6/2014 |
| WO | WO 2014/117245 A1 | 8/2014 |
| WO | WO 2015/022036 A1 | 2/2015 |

OTHER PUBLICATIONS

International Search Report and Written Opinion for PCT Application No. PCT/US15/066547; dated Mar. 17, 2016.
Sensors Drive Mobile IoT; Wong, William; Jan. 26, 2015; Electronic Design.
International Search Report and Written Opinion for PCT Application No. PCT/US16/028724; dated Aug. 22, 2016.
International Search Report and Written Opinion for PCT Application No. PCT/US16/18831; dated Aug. 12, 2016.
Continuous Hidden Markov Model Based Gear Fault Diagnosis and Incipient Fault Detection by Jian-She Kang, et al., dated Jun. 2011, published by Institute of Electrical and Electronics Engineers (IEEE).
Study on Fault Diagnosis of Gear with Spall using Ferrography and Vibration Analysis by Wei Feng, et al., published in Aug. 2009 at the International Conference on Measuring Technology and Mechatronics Automation.
Detection of Generalized-Roughness Bearing Fault by Spectral-Kurtosis Energy of Vibration or Current Signals by Fabio Immovilli, et al., IEEE Transations on Industrial Electronics, vol. 56, No. 11, Nov. 2009.
Intrinsic Mode Function Determination of Faulty Rolling Element Bearing Based on Kurtosis by Wei Kang, et al., Proceeding of the 2015 IEEE International Conference on Information and Automation, Lijiang, China, Aug. 2015.
Condition Monitoring and Fault Diagnosis of Rolling Element Bearings Based on Wavelet Energy Entropy and SOM by Shuai Shi, et al., dated Aug. 2012, published by IEEE.
Fault Diagnosis of Bearing Based on Fuzzy Support Vector Machine, by Haodong Ma, et al., dated Jan. 2015, published by IEEE.
Investigation of the Mechanical Faults Classification using Support Vector Machine Approach by Zhiqiang Jiang, et al., dated Aug.

(56) References Cited

OTHER PUBLICATIONS 2010, 2010 Second International Conference on Intelligent Human-Machine Systems and Cybernetics.
Impact Characterization of Multiple-Points-Defect on Machine Fault Diagnosis by Muhammad F. Yaqub, et al., 8th IEEE International Conference on Automation Science and Engineering, Aug. 20-24, 2012, Seoul, Korea.
Detection of Precursor Wear Debris in Lubrication Systems by Jack Edmonds, et al., dated May 2000, published by IEEE.
A Diagnostic Expert System Embedded in a Portable Vibration Analysis Instrument by Dr. Robert Milne, et al., dated May 13, 1991, published at IEE Colloquium on Intelligent Instrumentation.
Fault Diagnosis Method Study in Roller Bearing Based on Wavelet Transform and Stacked Auto-encoder, by Junbo Tan, et al., dated Feb. 2015, published by IEEE.
Fault Monitoring and Diagnosis of Induction Machines Based on Harmonic Wavelet Transform and Wavelet neural Network by Qianjin Guo, et al., dated Sep. 2008, published at the Fourth International Conference on Natural Computation.
Fault Detection in Kerman Combined Cycle Power Plant Boilers by Means of Support Vector Machine Classifier Algorithms and PCA by M. Berahman, et al., 3rd International Conference on Control, Instrumentation, and Automation (ICCIA 2013), Dec. 28-30, 2013, Tehran, Iran.
International Search Report and Written Opinion for PCT Application No. PCT/US2016/067814; dated Apr. 6, 2017.
International Search Report and Written Opinion for PCT Application No. PCT/US2016/067546; dated Apr. 11, 2017.

\* cited by examiner

AUTOMATED DIGITAL EARTH FAULT SYSTEM

FIELD OF TECHNOLOGY

The present invention relates to a system and method for detecting earth faults and more particularly to a system and method for constantly monitoring earthing values and providing a predictive early warning of failure.

BACKGROUND

Mobile communication towers are installed on various sites for increasing the network coverage for mobile communication systems. The base station equipment is normally located on a pad, typically a concrete pad directly under the tower or adjacent to the mobile communications tower. There is a direct metallic path from the mobile communications tower to the base station equipment ground bus, for protecting the mobile communications tower and associated costly communication equipment from earth faults caused by lightning and other power surges. When a fault occurs on the mobile communications tower, there is a distinct possibility of fault current and voltage transferring into the service neutral. Normal construction practices for installations do not always provide adequate protection to the tower and associated costly communication equipment.

As new demands for increasing the communication capabilities are placed on the mobile communication system, more mobile communications towers are built and/or upgraded in existing right-of-ways. Due to which fewer maintenance outages are accommodated and maintenance personnel are encountering new challenges in their work. For ensuring interruption free communication, the possible earth faults may be avoided by constantly measuring the earthing values and alerting the operator personnel regarding the possible outages. High earth values of the EGB (an acronym for "external ground bar") and IGB (an acronym for "Internal ground bar") may damage the mobile communications tower. Ultimately tower companies face a huge loss at the end of the year for maintenance and replacement of these components.

There are many devices commercially available in the market to monitor the earth values. But, soil resistivity changes with the location and therefore earth value also changes. A more advanced earth fault remote sensing apparatus in the market includes a permanently mounted control and display unit powered by an AC supply. However the power and control circuitry employed in the apparatus is complex and needs a power convertor circuitry for converting the AC power to DC power for operating the digital components including the microcontroller circuitry and display unit. Moreover the apparatus is permanently attached to the device to be protected and does not include a calibration mechanism for adjusting the reference earthing value of the microcontroller, as the earth resistivity depends on the soil and changes from place to place. Further, the apparatus is not portable as it is designed to use as a permanent attachment to the equipment to be protected. So there are no devices available which will monitor the earth values of the tower irrespective of the location remotely and capable of responding to changing soil resistance in a dynamic way.

Earth resistance varies with the soil resistivity. In order to check the earth value of the mobile communications tower and/or a similar office configuration that houses machines, a device that will work irrespective of location is required. Devices currently available in the market can't work irrespective of location without adjusting the reference value of the earthing. Some earth fault detectors are powered by a high operating voltage supply and are not efficient. The accurate earthing values of the mobile communications tower at different locations cannot be measured using existing devices. Existing devices and methods may apply a low electrode voltage. Many times such low electrode voltage may be required, since poor maintenance conditions may damage existing installations using a high voltage method. Moreover, existing devices do not have technology for early detection of possible earth faults which may be detected by measuring other parameters like soil moisture, regression trend and applying a predictive algorithm. In addition, existing devices in market cannot be employed for automatic and remote real time monitoring of earthing values associated with a large number of mobile communication towers because such large numbers would need a scalable alarm system specifically built for an alarm configuration of the large numbers instead of existing no-contact alarms in a cell tower location. These devices are heavy; measurement is independent of ground location. Further, these devices include complex circuitry and provide only intermittent manual operation, in addition to requiring a large enclosure for covering. Hence the devices are difficult to maintain and cannot be easily ported to a desired location.

U.S. Pat. No. 8,390,299 B2 discloses an Earth ground tester with remote control. The testing device comprises a main unit and a remote unit adapted to communicate with one another via a communication link. After setting the testing device up, according to the desired measurement technique, the measurement procedure may be carried out, and resulting measurement values are subsequently displayed on the remote unit. This allows a single operator to perform measurements while standing directly adjacent to an electrode, which is, for example, placed at a large distance from the main unit and/or other electrodes. This relieves the operator from constantly having to walk back and forth placing electrodes in different positions, and also obviates the need to return to the main unit of the testing device to consult a display and/or to change parameters or settings. The drawback with U.S. Pat. No. 8,390,229 B2 is that the measurement is not really remote. Further, the operator needs to make measurements manually and the device fails to collect readings from multiple locations. Still further, the '299 patent does not take into consideration; the change in soil resistivity from one location to another and also fails to map data collected onto a predictive, preventative and prescriptive system.

PCT publication WO 2010/104735 A1 discusses a device and method for detecting ground potential rise (sometimes hereinafter "GPR"), the method comprising positioning a first electrode and a second electrode at a distance from each other and extending into the Earth. The voltage of the first electrode and second electrode is attenuated by an attenuation factor creating an attenuated voltage. The true RMS voltage of the attenuated voltage is determined creating an attenuated true RMS voltage. The attenuated true RMS voltage is then multiplied by the attenuation factor creating a calculated true RMS voltage. If the calculated true RMS voltage is greater than a first predetermined voltage threshold, a first alarm is enabled at a local location. If user input is received at a remote location acknowledging the first alarm, a first alarm acknowledgment signal is transmitted. The first alarm acknowledgment signal is then received at which time the first alarm is disabled. However, this application fails to work with low electrode voltage applied to ground and map data collected onto a predictive, preventative and prescriptive mechanism for equipment by taking into account the other sensor and/or manual parameters (like soil test result, soil humidity) along with time series progression of the increasing resistance value.

U.S. Pat. No. 8,405,940 B2 discloses a system and method for generator ground fault protection. A generator winding-to-ground fault detection system is discussed, the system includes a signal injection source in electrical communication with a winding of an electric power generator via an injection transformer. The winding may be coupled to ground via a winding-to-ground path and the signal generation source may generate an injection signal capable of being injected to the winding using the injection transformer. The disclosed system may further include a protection module in communication with the signal injection source and the electric power generator configured to receive the injection signal and a signal relating to the current through the winding-to-ground path respectively to determine the occurrence of a winding-to-ground fault condition based at least in part on the injection signal and the signal relating to the current through the winding-to-ground path. Similar to WO 2010/104735 A1, this application fails to work with low electrode voltage applied to ground and map data collected onto a predictive, preventative and prescriptive mechanism for equipment by taking into account the other sensor and/or manual parameters (like soil test results, soil humidity) along with time series progression of the increasing resistance value.

Thus, there still exists a need for a system and method for detecting earth faults that can be used with the mobile communication towers and/or similar machine housing setups, to protect the towers and associated communication equipment from possible earth faults. There exists a need for a system and method for detecting earth faults that could provide early warning of failure from associated soil condition and time series progression of earth resistance value. Moreover, there exists a need for a system that would provide accurate readings in accordance with corresponding ground locations by accommodating soil condition parameters. Further, there exists a need for a system that would incorporate smaller circuit and power supply in a small enclosure with far reduced electrode voltage for soil resistance measurement. Moreover, there is also a need for a system that would enable automatic and remote monitoring of earthing value for any number of towers located in various geographic locations.

It is evident from the discussion of the aforementioned prior art that none of them pave way for the predictive (early warning) and preventive maintenance of an earthing system through machine learning of earth resistance time series values, alarms and soil condition of various locations.

Further, early warning or prediction of failure of Earth resistance values (For example: when earthing resistance crosses a 6 Ohm value) reduces the risk associated with maintenance of mobile towers as it prevents "run to failure" model. The prior arts merely provides an alarm for "run to failure" model but fails to suggest regarding early warning or predictive maintenance of Earth resistance values. The prior arts also fails to suggest a predictive engine that incorporates soil parameters obtained from sensor value or known test results of the soil. Therefore, there is a need in the art for a solution to the aforementioned problem.

SUMMARY

Disclosed are a method, an apparatus and/or a system of automated earth fault testing.

This invention relates to an automated earth fault testing system for measuring earth resistance value (earthing value) at any desired location. The automated earth fault testing system is particularly designed to be used with mobile towers for constantly monitoring the earthing value. The automated earth fault testing system comprises an earth fault testing device comprising a plurality of terminals for accurate determination of an earth fault value at any desired ground location. The earth fault testing device is powered by at least one power supply means, which includes a low voltage direct current power supply incorporated with the earth fault testing device; at least one calibration switch including a calibration pad associated with the earth fault testing device for calibrating the earth fault testing device for a particular ground location, which ensures accurate determination of a corresponding earth fault value at the ground location. The device further includes a plurality of visual indication for providing indication of a variety of conditions including high and/or normal value of the earth resistance value and indicating a charge level of the earth fault testing device. The earth fault resistance value coming in as input is fed into a computational machine running one or more predictive algorithms. The input includes time series progression of the earth fault resistance value and soil parameters such as soil moisture, chemical composition etc. The time series progression of the earth fault resistance value and the soil parameters can be obtained with additional sensors and/or an information database. Hardware of the automated earth fault testing system is not intended for soil parameter measurement but the predictive algorithm incorporates a soil condition as external training and input to predict an early failure of earthing resistance in advance.

A display of the earth fault testing device, preferably a liquid crystal display (LCD) and/or a connected mobile application, displays a plurality of information including the specific soil resistance estimated by using the plurality of electrodes. The earth fault testing device is connected to an alarm system of a base transceiver station (BTS) of the mobile signal station utilizing at least one relay. At least one communication means associated with the earth fault testing device can be used for informing the mobile signal station and at least one operator's device with an information regarding a status of the earth fault testing device and earth faults. The plurality of visual indication means provided with the earth fault testing device includes a red, yellow and green light emitting diodes (LED) for providing indication of a variety of conditions including a high value of the earth resistance that may cause an earth fault, indicating a low charge level of the earth fault testing device, and a safe value of earth resistance respectively.

The earth fault testing device is connected to the mobile communication tower and/or to the associated equipment to measure the earthing values associated with them. The plurality of terminals of the earth fault testing device is connected to appropriate devices/places including a reference earth, device's earth, device's body and the fourth and final terminal connected to the relay circuit for connecting to the alarm circuit of the BTS. The earth fault testing device is calibrated to adjust the reference values according to the particular location. The earth fault testing device will continuously measure the earthing values associated with the mobile communication tower and associated equipment and respective visual indications will be produced based on measured values. In case if the earthing value is higher than the predefined earthing values, then a visual alarm is produced and the alarm system of the BTS may be triggered by the earth fault testing device by signaling the relay associated with one of its terminals. In addition, the earthing values are being sent to a server using mobile and/or LAN line and the earthing values are used in the predictive algorithm in conjunction with soil parameters for generating early warning of impeding high resistance crossing an alarm threshold.

Other objects and advantages of the embodiments herein will become readily apparent from the following detailed description taken in conjunction with the accompanying drawings. The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not as limitation in the figures of the accompanying drawings, in which like references indicate similar elements and in which.

Figure 1:
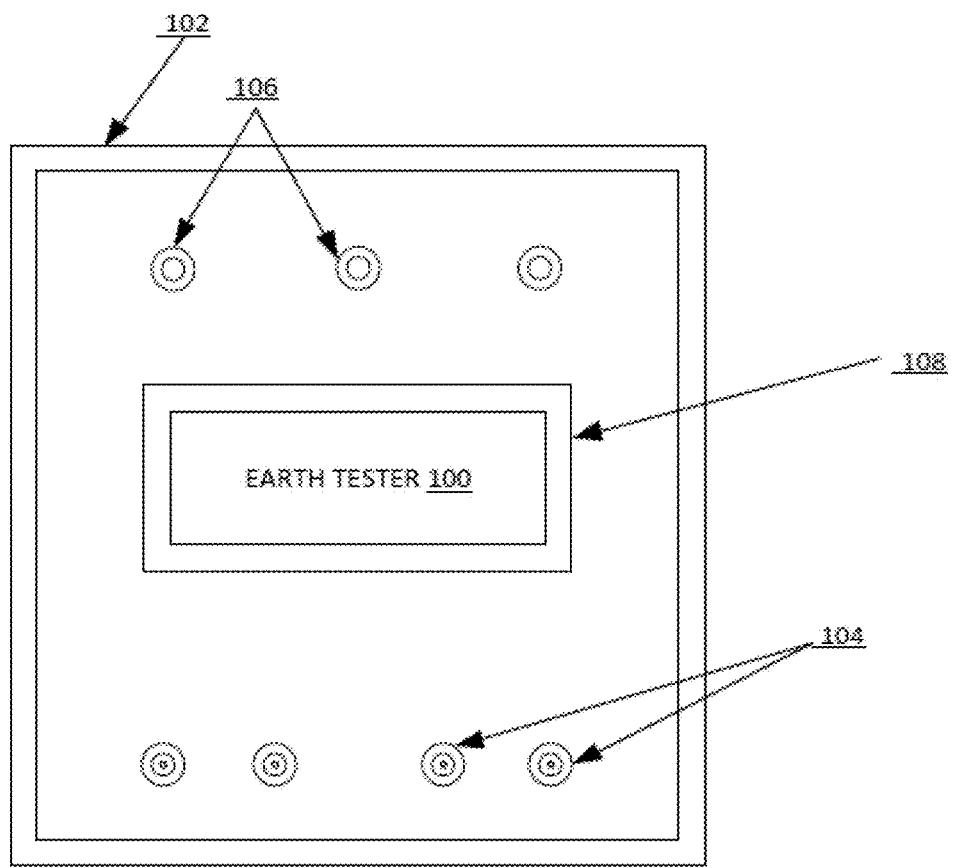
FIG. 1 illustrates a front view of an automated earth fault testing system for measuring earth resistance value at any desired location, according to an embodiment of the present invention.

Other features of the present embodiments will be apparent from the accompanying drawings and from the detailed description that follows.

DETAILED DESCRIPTION

Example embodiments, as described below, may be used to provide a method, an apparatus and/or a system for constantly monitoring earthing values and an early warning system associated with mobile communication towers. Although the present embodiments have been described with reference to specific example embodiments, it will be evident that various modifications and changes may be made to these embodiments without departing from the broader spirit and scope of the various embodiments.

The present invention relates to a system and method for detecting earth faults and more particularly to a system and method for constantly monitoring earthing values and an early warning system in any location where machines may be damaged from lightning. The machines including a mobile tower where communication equipment damage from severe lightning is commonplace. The system also provides an early warning system based on predictive modeling and/or machine learning of time series values of the earthing resistance and soil parameters.

Communication towers include signal processing equipment that is particularly susceptible to noise generated from within the power system and grounding system for the tower. Poor grounding contributes to personnel safety problems as well as interference with signal processing equipment resulting in unnecessary downtime. Lack of good grounding is also dangerous and increases the risk of equipment failure. Communication towers are generally equipped with power supplies for signal communications, controls, lighting, air conditioning and auxiliary equipment that may introduce transient voltages into the communications signals, if not properly grounded. Without an effective grounding system, the signal communication towers and equipment could be exposed to the risk of electric shock, instrumentation errors, signal distortion issues, power supply problems and a host of possible intermittent equipment outages. Furthermore, tall towers attract lightning. The high current of a lightning strike can cause extreme voltage changes if the grounding system is not properly designed based on the soil resistivity at a corresponding location. If fault currents have no path to the ground through a properly designed and maintained grounding system, they will find unintended paths that could include costly signal processing equipment.

In an example embodiment, an internet of things (TOT) sensor network may be coupled to the communications tower. The communications tower may include a communication means including but not limited one of "WiFi", which is a generic term for wireless communication, usually suggestive of the Internet", "2G", namely second-generation wireless telephone technology, "3G," namely third generation wireless telephone technology, "4G", namely fourth generation wireless telephone and mobile communication technology, "GPRS", which is a packet-oriented mobile data service available on both 2G and 3G cellular communication systems, "EDGE", which is a proprietary communications service, "Bluetooth", which is a collection of communication protocols for radio frequency communications systems, "ZigBee", which is a specification for a suite of high-level communication protocols used in creating personal area networks built from small, low-power digital radios based on the IEEE 802.15.4 standard, Piconet of "BLE", which is an abbreviation for "Bluetooth Low Energy" which in turn is a wireless personal area network technology and protocol, "Zwave", which is a wireless technology used principally for home automation applications, or a combination thereof.

Referring to FIG. 1, an automated earth fault testing system 100 for measuring earth resistance value at any desired location is disclosed. The preferred embodiment of the present invention discloses the automated earth fault testing system 100 for measuring earth resistance value at any desired location. The automated earth fault testing system 100 is particularly designed to be used with mobile towers for constantly monitoring the earthing value. The automated earth fault testing system 100 comprises an earth fault testing device 102 comprising a plurality of terminals 104 for accurate determination of an earth fault value at any desired ground location. The earth fault testing device 102 is powered by at least one power supply means (not shown). The at least one power supply means includes a low voltage direct current power supply incorporated in the earth fault testing device 102. At least one calibration switch (not shown) including a calibration pad (not shown) associated with the earth fault testing device for calibrating the earth fault testing device for a particular ground location, wherein the at least one calibration switch with the calibration pad can be employed to adjust a reading of the earth fault testing device depending on the particular ground location thereby ensuring accurate determination of the corresponding earth fault value at the ground location. A plurality of visual indication means 106 is provided with the earth fault testing device 102 for providing indication of a variety of conditions including high and/or normal value of the earth resistance value and also indicating a charge level of the earth fault testing device. A display 108 for displaying the measured general earth resistance value.

In one or more embodiments, an automated earth fault testing system may be communicatively coupled to an Internet of things (IOT) sensor network. The IOT sensor network may be distributed across locations wherever earth fault testing may be necessary.

Figure 2:
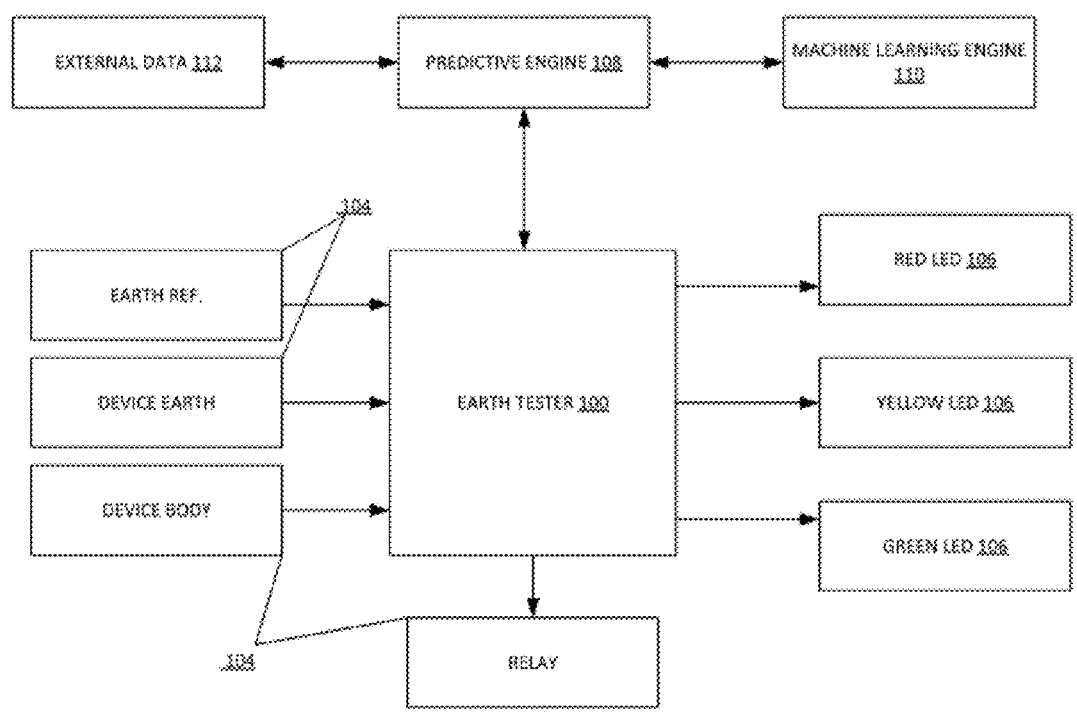
FIG. 2 illustrates a block diagram of the automated earth fault testing system, according to an embodiment of the present invention.

FIG. 2 illustrates a block diagram of the automated earth fault testing system 100 according to a preferred embodiment of the present invention. The automated earth fault testing system 100 includes the earth fault testing device 102 for measuring a specific soil resistance for distribution through three electrodes according to an embodiment of the present invention. As shown therein, the earth fault testing device 102 includes the at least one power supply means and at least three electrodes attached to the plurality of terminals 104 of the earth fault testing device 102. The three electrodes receives the power from the power supply means provided with the earth fault testing device 102 and is used in estimating the specific soil resistance associated with the mobile signal station by a three-electrode method. Earth resistance testing terminal among the plurality of terminals 104 of the earth fault testing device 102, measures the earth resistance and hence the earth fault related to the mobile signal station. The earth fault testing device 102 provides a digital output signal of the earth resistance measured by the earth resistance testing terminal. A display 108 of the earth fault testing device 102, preferably a liquid crystal display (LCD) displays a plurality of information including the specific soil resistance estimated by using the three electrodes. Further, the earth fault testing device 102 is connected to an alarm system (not shown) of a base transceiver station (BTS) of the mobile signal station utilizing at least one relay. At least one communication means associated with the earth fault testing device 102 can be used for informing the mobile signal station and at least one operator's device with information regarding a status of the earth fault testing device and earth faults. The plurality of visual indication means 106 is provided with the earth fault testing device 102 includes a red, yellow and green light emitting diodes (LED) for providing indication of a high value of the earth resistance that may cause an earth fault, a low charge level of the earth fault testing device, and a safe value of earth resistance respectively.

The specific soil resistance or soil resistivity measured by the three-electrode method using the earth fault testing device 102 and the specific soil resistance obtained by the general earth-resistance measurement expression is compared with a preset value and analyzed. The automated earth fault testing system 100 for measuring the earth fault values measures the fault value by measuring the soil resistivity using the earth fault testing device 102 and a plurality of electrodes. The electrodes are manufactured in the form of a metallic rod, and an fault analysis algorithm is embedded in a digital earth fault testing device 102 for measuring both the earth fault value and the specific soil resistance and for triggering an alarm in the event of a high earth fault value.

The automated earth fault testing system 100 including the digital earth fault testing device 102 can be employed to constantly monitor the earthing value of a plurality of devices and a mobile tower or a mobile signal station. The automated earth fault testing system 100 can be employed to remotely monitor the earth values of the mobile tower or the mobile signal station continuously, irrespective of the location as the soil resistivity and the earth value changes according to the location. In a preferred embodiment, the earth fault testing device 102 operates on a low voltage direct current (DC) from a plurality of standard size batteries such as 5 v DC AA batteries or Mignon batteries. The batteries are leakage proof and use only a low voltage so that it won't cause any damage to the mobile signal tower or to the components of the automated earth fault testing system 100. Earth resistance varies with the soil resistivity. For measuring the changing soil resistivity and corresponding earth value with the location, a calibration switch is employed. The calibration pad provided with the earth fault testing device 102 includes a plurality of reference earth value for different location. If the earthing value at a particular location of the mobile signal station is more than the reference earth value in the calibration pad, then a visual alarm or the visual indication means 106 for earth fault is produced by the LED. In a preferred embodiment of the present invention, a red LED will glow if the earth value of the mobile tower goes higher than a predefined value. In addition, if the earth is open or if any of the plurality terminals 104 of the earth fault testing device 102 are open, then the red LED will glow indicating the visual alarm. Further, in the preferred embodiment the earth fault testing device 102 is connected to the alarm system of the BTS. If the earthing value of the mobile tower goes higher than the predefined value, the red LED will glow to indicate the fault and the relay connected the existing alarm system of the BTS will also be activated to notify the operator by preferably producing a loud audible signal. The earth fault testing device 102 of the preferred embodiment of the present invention includes a smaller embedded circuitry consisting of micro controllers and battery, covered using a small enclosure. Hence the earth fault testing device 102 is very small and has a very small electronic circuit configured for checking and analyzing the earthing value of the mobile tower.

Further, the automated earth fault testing system 100 (earth tester 100) may be communicatively coupled to a predictive engine 108 and a machine learning engine 110. The predictive engine may in turn be associated with a predictive algorithm (not shown) and the machine learning engine may be associated with a machine learning algorithm (not shown). The predictive engine 108 may have multiple inputs such as from earth tester 100 and external data 112 such as soil parameters. External data 112 may include various soil related data available pertaining to factors such as chemical composition, humidity etc., from a variety of sources. The external data 112 may be obtained from other sensors and/or off-line measurement.

The present invention may be used for real time measurement and monitoring of the grounding system of a communication tower, but is not limited only to such applications. Continuous monitoring of the ground system is essential to maintain the integrity of the communications or other grounding systems. The present invention may be utilized as a temporary or permanent installation, to measure the earthing values of the mobile communication tower. Thus, the present invention provides an apparatus and method of testing a local grounding point of a telecommunications tower. The automated earth fault testing system 100 comprises three terminals that are connected to reference earth, device earth and device body.

Figure 3:
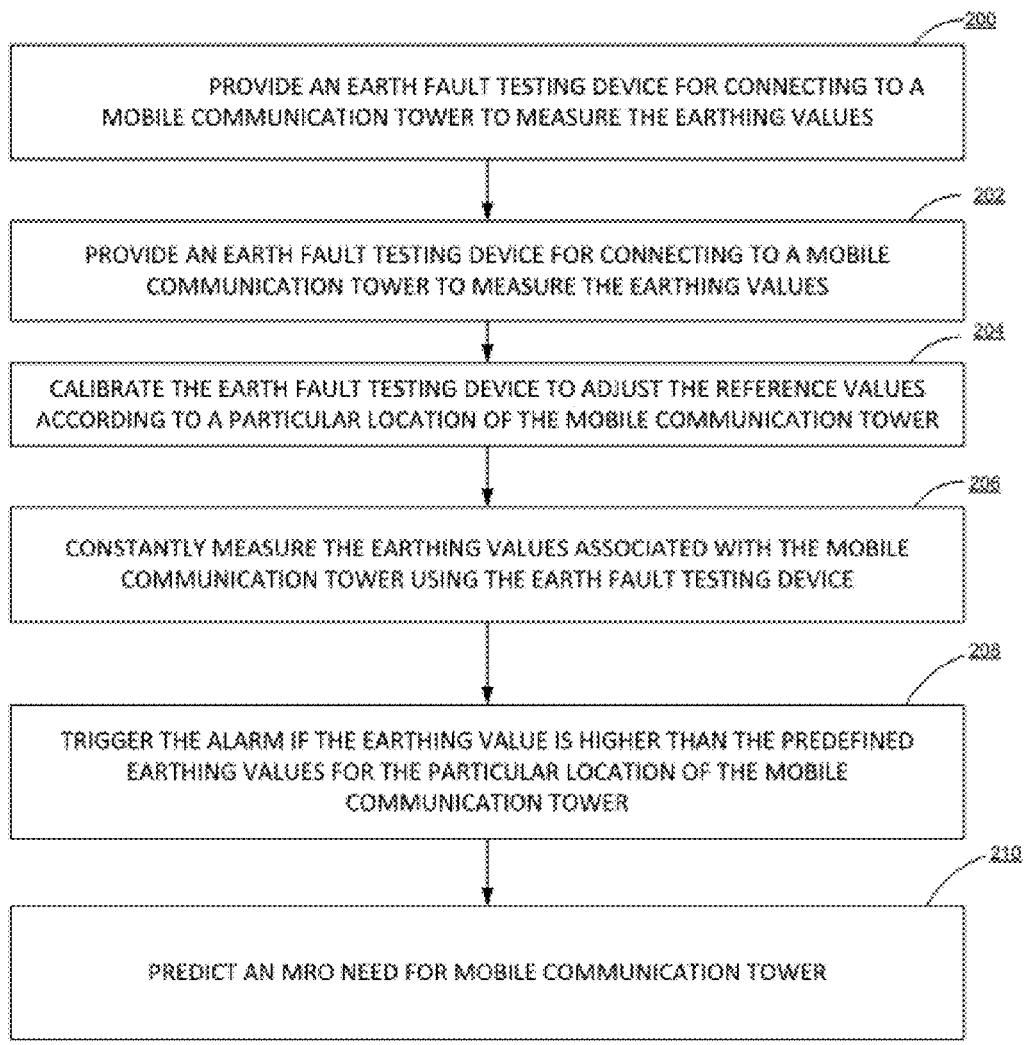
FIG. 3 illustrates a flowchart of a method for measuring the earthing value, according to an embodiment of the present invention.

FIG. 3 illustrates a flowchart of a method for measuring the earth fault according to an embodiment of the present invention.

The method of measuring the earth fault using the automated earth fault testing system 100 starts by creating a reference earth pit giving the earth resistance value of earth pit as 5 ohms. In a preferred embodiment, a chemical called ECEMC (Earth Conductivity Enhancing Mineral Compound) is employed to create a pair of reference earth pit having an earth resistance value of 5 ohms. After creating the reference earth pit, one terminal among the plurality of terminals 104 of the earth fault testing device 102, is connected to the reference earth pit and a second connection from the earth pit of the BTS (base transceiver station) is made with another terminal of the earth fault testing device 102. A third connection from the body of the BTS is given to a third terminal of the earth fault testing device 102. Now the earth fault testing device 102 can be powered on to visualize the value of the earth resistance on the LCD display 108. If the earthing value displayed on the LCD display 108 is more than the threshold value set by the calibration pad on the earth fault testing device 102, the red LED will be illuminated and the relay connecting the earth fault testing device 102 with the alarm system of the BTS may get triggered. However, if the earthing value displayed on the LCD display 108 is less than the threshold value set by the calibration pad on the earth fault testing device 102, the green LED will be illuminated, showing normal operation. The plurality of batteries for powering the earth fault testing device 102 is user replaceable and a low battery level is indicated by a yellow LED illuminated on the earth fault testing device 102.

According to yet another embodiment of the present invention, the earth fault testing device 102 is equipped with a communication module for informing the operator of the mobile communication tower whenever the red LED is illuminated, indicating a high earthing value. The earth fault testing device 102 can send a message (SMS) to the operator whenever there comes any fault in the mobile communication tower. In a further embodiment of the present invention, a mobile application can be integrated with the earth fault testing device 102 which will display the real time status of the earthing values on any communication device installed with the mobile application, by communicating with the earth fault testing device 102 through the mobile application. The communication device may include a portable mobile phone, smartphone, tablet, computer, wearable smart device, etc. capable of running the mobile application. Moreover, the mobile application may be an android application, iOS application, windows phone application, or any other web application capable of being installed to any of the communication devices.

However, good grounding isn't only for safety, it is also used to prevent damage to costly communication equipment and service outages. A good grounding system obtained by employing equipment such as automated earth fault testing system 100 will improve the reliability of communication equipment and reduce the likelihood of damage due to lightning or fault currents. The plurality of electrodes acting as ground conductor is removably connected to the plurality of terminals 104 of the earth fault testing device 102. The ground conductor can be any metallic part, such as a rod, screw, nail, copper wire etc. The ground conductors are generally made of highly conductive material such as steel or copper and are firmly attached to the earth pit. Soil resistivity is most necessary to determine the earth fault values associated with the mobile communication tower. The soil properties such as soil composition, moisture content, temperature and the like impact the soil resistivity and hence the earthing values also changes for different mobile communication tower located at different locations. For a grounding system to be effective, the real time data from the earth fault testing device 102 need to be continuously monitored and analyzed.

FIG. 3 illustrates a flowchart of a method for measuring the earthing values of a mobile communication tower and associated equipment by employing the earth fault testing device 102 according to an embodiment of the present invention. The method starts by providing a earth fault testing device 102 for connecting to the mobile communication tower and/or to the associated equipment to measure the earthing values associated with them as shown in block 200. Later, as shown in block 202, the plurality of terminals 104 of the earth fault testing device 102 is connected to appropriate devices/places including a reference earth, device's earth, device's body and the fourth and final terminal connected to the relay circuit for connecting to the alarm circuit of the BTS. Now as shown in block 204, the earth fault testing device 102 is calibrated to adjust the reference values according to the particular location. The calibration is done by referring the calibration pad provided with the earth fault testing device 102 and the operator may adjust the reference value by adjusting the calibration switch of the earth fault testing device 102. The earth fault testing device 102 will continuously measure the earthing values associated with the mobile communication tower and associated equipment and the respective visual indications will be produced, as shown in block 206. In case, if the earthing value is higher than the predefined earthing values, then a visual alarm is activated and the alarm system of the BTS may be triggered by the earth fault testing device 102 by signaling the relay associated with one of its terminals, as illustrated in block 208. The alarm produced may also include automatically sending short messaging services to predefined contacts. Further, based on predictive engine trigger, a prediction of MRO (maintenance, repair and operation) for mobile communication tower may be sent in block 210.

The method of installing the automated earth fault testing system 100 starts by creating a reference earth pit which would give the earth resistance earth pit value as 5 ohms. For creating the reference earth pit, a chemical called ECEMC (Earth Conductivity Enhancing Mineral Compound) is used. Using this chemical two earth pits is developed which will give the value of the reference earth pit as 5 ohms. After developing the reference earth pit a connection is taken from it and the connection will be given to the device which is to be protected. Another connection will come from the earth pit of the BTS (base transceiver station). One more Connection will be from the body of the BTS. A fourth connection is made to the alarm system of the BTS through a relay.

The earth fault testing device 102 uses the plurality of terminals 104 for measuring the earthing values at a particular location of the mobile communication tower. The plurality of terminals 104 includes: a first terminal for connection to the reference earth; a second terminal for connection to the device earth such as to earthing connection of the mobile communication tower or the communication equipment at the BTS; a third terminal for providing connection to the body of the mobile communication tower and/or associated equipment; and a fourth terminal connected to an alarm system of the BTS through a relay circuit for triggering the alarm whenever there arises chances for an earth fault recognized by the earth fault testing device 102. The calibration pad includes a plurality of values for the reference earth corresponding to a plurality of locations where the mobile communication towers are installed. The operator can adjust the reference earthing value of the earth fault testing device 102 corresponding to the location of the mobile communication tower by looking into the calibration pad. The operator can refer the calibration pad for an earthing value corresponding to the desired location and the calibration switch can be manually adjusted to change the reference earthing value. The measured earthing value by the earth fault testing device 102 is compared against the reference value set using the calibration pad and calibration switch and if the measured earthing value crosses the predefined reference value, then a visual alarm will be produced by the LED. In the event of a possible earth fault, the relay associated with the earth fault testing device 102 will be activated to sound the BTS alarm. The earth fault testing device 102 employs embedded electronic circuitry, for performing calculation for predicting the chances of earth fault, and hence the earth fault testing device 102 is light weight, compact and portable.

In an example embodiment, an internet of things (IOT) sensor network may be coupled to a communications network and/or a communication means. The IOT sensor network may also couple to an IOT server. The communications means may comprise one of "WiFi", which is a generic term for wireless communication, usually suggestive of the Internet", "2G", namely second-generation wireless telephone technology, "3G," namely third generation wireless telephone technology, "4G", namely fourth generation wireless telephone and mobile communication technology, "GPRS", which is a packet-oriented mobile data service available on both 2G and 3G cellular communication systems, "EDGE", which is a proprietary communications service, "Bluetooth", which is a collection of communication protocols for radio frequency communications systems, "ZigBee", which is a specification for a suite of high-level communication protocols used in creating personal area networks built from all, low-power digital radios based on the IEEE 802.15.4 standard, Piconet of "BLE" which is an abbreviation for "Bluetooth Low Energy" which in turn is a wireless personal area network technology and protocol, "Zwave", which is a wireless technology used principally for home automation applications, or a combination thereof.

In an example embodiment, the earth fault testing device may associated with a machine wearable sensor.

In an example embodiment, the earthing value may mapped into one or more predictive maintenance states. Predictive maintenance (PM) states may be derived from multiple sets of data collected from the earth fault testing device.

In an example embodiment, a machine learning engine may be coupled to a predictive analytics engine. The machine learning engine coupled to the predictive analytics engine may indicate on a user interface, a set of analytical predictions for machine maintenance, operation and repair. Further, a communication means associated with the earth fault testing device may inform a cloud based IOT (Internet of things) server. The user interface may be associated with an application. An MRO (maintenance, repair and operation) engine can accept automatic and manual parameters from the soil parameters.

In one or more embodiments, the application may associated with one or more of a mobile phone, television, kiosk, touch screen device, and a server.

Figure 4:
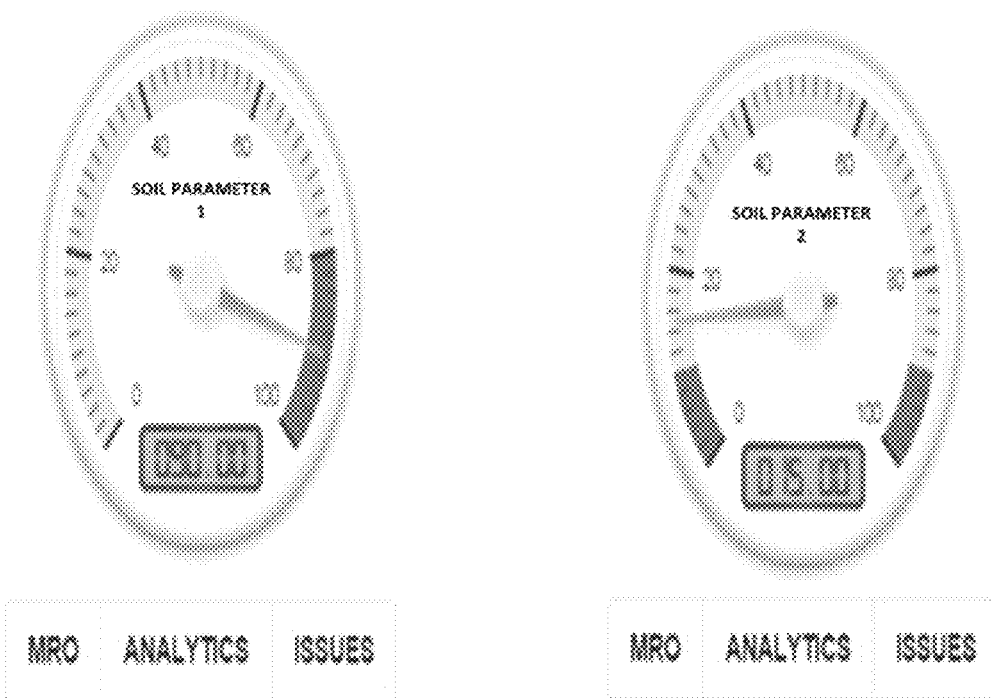
FIG. 4 is a diagrammatic representation of a fuel gauge to depict a predictive maintenance state, according to one example embodiment.

In one or more embodiments, the application may include a fuel gauge associated with color schemes. Fuel gauge is a 0-100 dialed analog representation of predictive maintenance state as shown in FIG. 4. The color scheme red may indicate a worst maintenance condition, yellow may indicate an intermediate condition, and green may indicate a best maintenance condition. Dialed values of Fuel Gauge may indicate best practiced calibrated value of predictive maintenance.

FIG. 4 is a diagrammatic representation of a fuel gauge to depict a predictive maintenance state, according to one example embodiment. FIG. 4 may depict fuel gauges for different soil parameters. Fuel gauge representation may help maintenance personal to understand status of a machine such as a mobile communications tower. Maintenance personal may not be equipped to understand data and make an inference based on the data. The fuel gauge representation of the predictive maintenance state of the machine may assist untrained maintenance personnel decipher predictive maintenance states based on the color schemes.

In one or more embodiments, IOT sensor network may include a means for prescriptive, preventative and predictive (3P) maintenance for a machine. Big data methodologies may be employed to analyze data obtained from various locations through the communications means. Big data may be used to describe a massive volume of both structured and unstructured data, since large volumes of data may be difficult to process using traditional databases and traditional software techniques.

In an embodiment, data may be collected from diverse locations 3P maintenance by using a combination of Cassandra (distributed database), Storm and/or Spark real time to process the data in real time through Big Data architecture and implemented using a broker system such as Kafka for storing alarms as buffer database and further using Cassandra like distributed database for a MRO (maintenance, repair and operation) system.

In one or more embodiments, an automated earth fault testing and early warning system for measuring an earthing value at any desired location may comprise of an earth fault testing device, one or more power supplies, a plurality of terminals, one or more calibration switches, a predictive algorithm in association with a predictive engine, and plurality of visual indication means. The earth fault testing device may be connected to an alarm system of a base transceiver station (BTS) of a mobile signal station utilizing one or relays. One or more communication means associated with the earth fault testing device may inform the mobile signal station and one or more operator devices with information regarding a status of the earth fault testing device. Further, the early warning system may predict a future date of failure, maintenance requirement date, repair requirement date, and/or number of days of normal operation for the BTS and/or the mobile signal station. The prediction may be a result of a calculation by the predictive algorithm in association with a predictive engine. The prediction may be arrived at by analyzing an input that includes time series progression of the earth fault resistance values and soil parameters such as soil moisture, chemical composition etc. The time series progression of the earth fault resistance values and the soil parameters may be obtained with additional sensors and/or an information database.

Further, the predictive algorithm may be associated with a machine learning engine that learns from patterns in earthing resistance values.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry, firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). The medium may be, for example, a memory, a transportable medium such as a CD, a DVD, a Blu-Ray™ disc, a floppy disk, or a diskette. A computer program embodying the aspects of the exemplary embodiments may be loaded onto the retail portal. The computer program is not limited to specific embodiments discussed above, and may, for example, be implemented in an operating system, an application program, a foreground or background process, a driver, a network stack or any combination thereof. The computer program may be executed on a single computer processor or multiple computer processors.

Accordingly, the specification and drawings are to be regarded in an illustrative rather than a restrictive sense.

What is claimed is:

1. An automated earth fault testing and early warning system for measuring an earthing value at any desired location comprising:
  a. an earth fault testing device comprising a plurality of terminals for determining the earthing value at any desired ground location;
  b. at least one power supply means for powering the earth fault testing device, including a low voltage direct current power supply incorporated with the earth fault testing device;
  c. at least one calibration switch including a calibration pad associated with the earth fault testing device for calibrating the earth fault testing device for a particular ground location, the earth fault testing device's reading depending on the particular ground location thereby ensuring accurate determination of the corresponding earth fault value at the ground location;
  d. an alarm for providing visual indication of a variety of conditions including high and/or normal value of the earthing value and indicating a charged level of the earth fault testing device, wherein the earth fault testing device is connected to the an alarm system of a base transceiver station of a mobile signal station utilizing at least one relay; and
  e. at least one communication means associated with the earth fault testing device, for informing the mobile signal station and at least one operator's device with information regarding a status of the earth fault testing device.

2. The system of claim 1, wherein the at least one communication means is one of "WiFi", which is a generic term for wireless communication, usually suggestive of the Internet", "2G", namely second-generation wireless telephone technology, "3G," namely third generation wireless telephone technology, "4G", namely fourth generation wireless telephone and mobile communication technology, "GPRS", which is a packet-oriented mobile data service available on both 2G and 3G cellular communication systems, "EDGE", which is a proprietary communications service, "Bluetooth", which is a collection of communication protocols for radio frequency communications systems, "ZigBee", which is a specification for a suite of high-level communication protocols used in creating personal area networks built from small, low-power digital radios based on the IEEE 802.15.4 standard, Piconet of "BLE", which is an abbreviation for "Bluetooth Low Energy" which in turn is a wireless personal area network technology and protocol, "Zwave", which is a wireless technology used principally for home automation applications, or a combination thereof and wherein the earth fault testing device is associated with a machine wearable sensor.

3. The system of claim 1, wherein the earthing value is mapped into one or more predictive maintenance states in association with soil parameters.

4. The system of claim 1, wherein a machine learning engine coupled to a predictive analytics engine indicates on a user interface a set of analytical predictions for machine maintenance, operation and repair to provide early failure indication of the earthing resistance, and wherein the at least one communication means associated with the earth fault testing device informs a cloud based IoT (Internet of things) server.

5. The system of claim 4, wherein the user interface is associated with an application; the application is associated with at least one of a mobile phone, television, kiosk, touch screen device, and a server; the application includes a fuel gauge associated with at least on color scheme; and within the color scheme:
  a. red indicates a worst maintenance condition,
  b. yellow indicates an intermediate condition, and
  c. green indicates a best maintenance condition.

6. A method of automated earth fault testing and early warning system for measuring an earthing value at any desired location, comprising:
  a. determining the earthing value at any desired ground location through an earth fault testing device;
  b. powering the earth fault testing device through at least one power supply means, including a low voltage, direct current power supply incorporated with the earth fault testing device;
  c. calibrating the earth fault testing device for a particular ground location through at least one calibration switch including a calibration pad associated with the earth fault testing device,
  d. using the at least one calibration switch with the calibration pad to adjust the earth fault testing device's reading depending on the particular ground location thereby ensuring accurate determination of the corresponding earth fault value at the ground location;
  e. providing indication of a variety of conditions, through an alarm system, including one of a high and normal value of the earthing value;
  f. indicating a charged level of the earth fault testing device, by connecting to the alarm system of a base transceiver station of a mobile signal station utilizing at least one relay; and
  g. informing, through at least one communication means associated with the earth fault testing device, the mobile signal station and at least one operator's device with information regarding a status of the earth fault testing device.

7. The method of claim 6, wherein the at least one communication means is one of "WiFi", which is a generic term for wireless communication, usually suggestive of the Internet", "2G", namely second-generation wireless telephone technology, "3G," namely third generation wireless telephone technology, "4G", namely fourth generation wireless telephone and mobile communication technology, "GPRS", which is a packet-oriented mobile data service available on both 2G and 3G cellular communication systems, "EDGE", which is a proprietary communications service, "Bluetooth", which is a collection of communication protocols for radio frequency communications systems, "ZigBee", which is a specification for a suite of high-level communication protocols used in creating personal area networks built from small, low-power digital radios based on the IEEE 802.15.4 standard, Piconet of "BLE", which is an abbreviation for "Bluetooth Low Energy" which in turn is a wireless personal area network technology and protocol, "Zwave", which is a wireless technology used principally for home automation applications, or a combination thereof and wherein the earth fault testing device is associated with a machine wearable sensor.

8. The method of claim 6, further comprising the steps of:
  a. mapping the earthing value into one or more predictive maintenance states; and
  b. informing, through the at least one communication means associated with the earth fault testing device, a cloud based IoT server.

9. The method of claim 6, further comprising the step of:
  a. indicating, through a machine learning engine coupled to a predictive analytics engine, on a user interface a set of analytical predictions for machine maintenance, operation and repair to provide early failure indication of the earthing resistance; wherein the user interface is associated with an application; wherein the application is associated with at least one of a mobile phone, television, kiosk, touch screen device, and a server; wherein the application includes a fuel gauge associated with color schemes; and within the color scheme:
    i. red indicates a worst maintenance condition;
    ii. yellow indicates an intermediate condition; and
    iii. green indicates a best maintenance condition.

10. An automated earth fault testing and early warning system for measuring an earth fault value at any desired location comprising:
  a. an earth fault testing device comprising a plurality of terminals insertable into the ground for determining the earth fault value at any desired ground location;
  b. at least one low voltage direct current power supply for powering the earth fault testing device, connected to the earth fault testing device;
  c. a calibration switch for actuating a calibration pad connected to the earth fault testing device, for calibrating the earth fault testing device for a particular ground location, by obtaining a reading from the earth fault testing device for the particular ground location and comparing the reading to a reading for a known standard ground fault value;
  d. a means for providing visible indication of conditions including high and/or normal earth fault values and indicating a charge level of a battery portion of the earth fault testing device;
  e. means for connecting the earth fault testing device to the an alarm system of a base transceiver station of a mobile signaling station; and
  f. wireless communication means associated with the earth fault testing device, for informing the mobile signal station and at least one operator device of the battery charge level and earth fault level and status of the earth fault testing device.

11. In the system of claim 10, the earth fault testing device further comprising:
  a. a machine learning engine;
  b. a predictive analytics engine operatively coupled to the machine learning engine;
  c. a user interface connected to the analytics engine for visually displaying a set of analytical predictions relating to system maintenance, operation and repair to provide early indication of a measured earth fault value outside of a preselected acceptable norm;
  d. communication means associated with the earth fault system for informing a cloud based IoT (Internet of things) server of the measured earth fault value being outside of the preselected acceptable norm.

12. A method of automated ground fault testing by measuring ground fault values at any desired location and warning of measured dangerous ground fault levels comprising:
  a. determining ground fault value at any desired location using a ground fault testing device;
  b. powering the ground fault testing device with a low voltage direct current power supply;
  c. calibrating the ground fault testing device for a particular location through using a calibration pad operatively associated with the ground fault testing device;
  d. using a calibration switch connected to the calibration pad to adjust the ground fault testing device reading for the particular ground location thereby ensuring accurate determination of the corresponding ground fault value;
  e. indicating charge level of a battery portion of the ground fault testing device, by connecting the ground fault testing device to an alarm system of a base transceiver station of a mobile signal station; and
  f. using communication means associated with the ground fault testing device to transfer a signal to a mobile signal station and an operator's device, the signal indicating status of the ground fault testing device.

* * * * *